(12) United States Patent
Chen et al.

(10) Patent No.: US 7,982,315 B2
(45) Date of Patent: Jul. 19, 2011

(54) SEMICONDUCTOR STRUCTURE AND METHOD OF MAKING THE SAME

(75) Inventors: Yinan Chen, Taipei (TW); Hsien-Wen Liu, Taoyuan County (TW); Tzu-Ching Tsai, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 152 days.

(21) Appl. No.: 12/165,587

(22) Filed: Jun. 30, 2008

(65) Prior Publication Data
US 2009/0256264 A1    Oct. 15, 2009

(30) Foreign Application Priority Data

Apr. 9, 2008    (TW) ............................... 97112830 A (51) Int. Cl.
*H01L 23/48*    (2006.01)
(52) U.S. Cl. ................... 257/760; 257/E23.141

(58) Field of Classification Search .................. 257/763, 257/774, 296, 303, E23.01, 700, 750, 701, 257/758, 760, 759, E23.141
See application file for complete search history.

(56) References Cited

U.S. PATENT DOCUMENTS

| 6,693,002 B2 * | 2/2004 | Nakamura et al. ............ 438/238 |
| 7,132,369 B2 * | 11/2006 | Delgadino et al. ............ 438/723 |
| 2007/0108509 A1 * | 5/2007 | Hashidzume et al. ........ 257/324 |

FOREIGN PATENT DOCUMENTS

CN    1423323 A    6/2003

* cited by examiner

*Primary Examiner* — Hoa B Trinh
(74) *Attorney, Agent, or Firm* — Winston Hsu; Scott Margo (57) ABSTRACT

A semiconductor device is provided. An amorphous silicon layer that acts as a UV blocking layer replaces a conventional silicon-rich oxide (SRO) layer or the super silicon-rich oxide (SSRO) layer. By doing this, the process window is increased. In addition, silicon nitride sidewall spacer is formed inside the contact hole to prevent charge loss.

11 Claims, 13 Drawing Sheets

SEMICONDUCTOR STRUCTURE AND METHOD OF MAKING THE SAME

BACKGROUND OF THE INVENTION

1. Field of the Invention

The present invention relates to a semiconductor structure and a method of making the semiconductor structure, and more particularly, to a semiconductor structure which can prevent charge loss and block UV light and a method of making the same semiconductor structure.

2. Description of the Prior Art

Non-volatile memories are widely used in modern portable electric devices and a non-volatile memory has an important characteristic of storing data in the memory even though the power is turned off.

Figure 1:
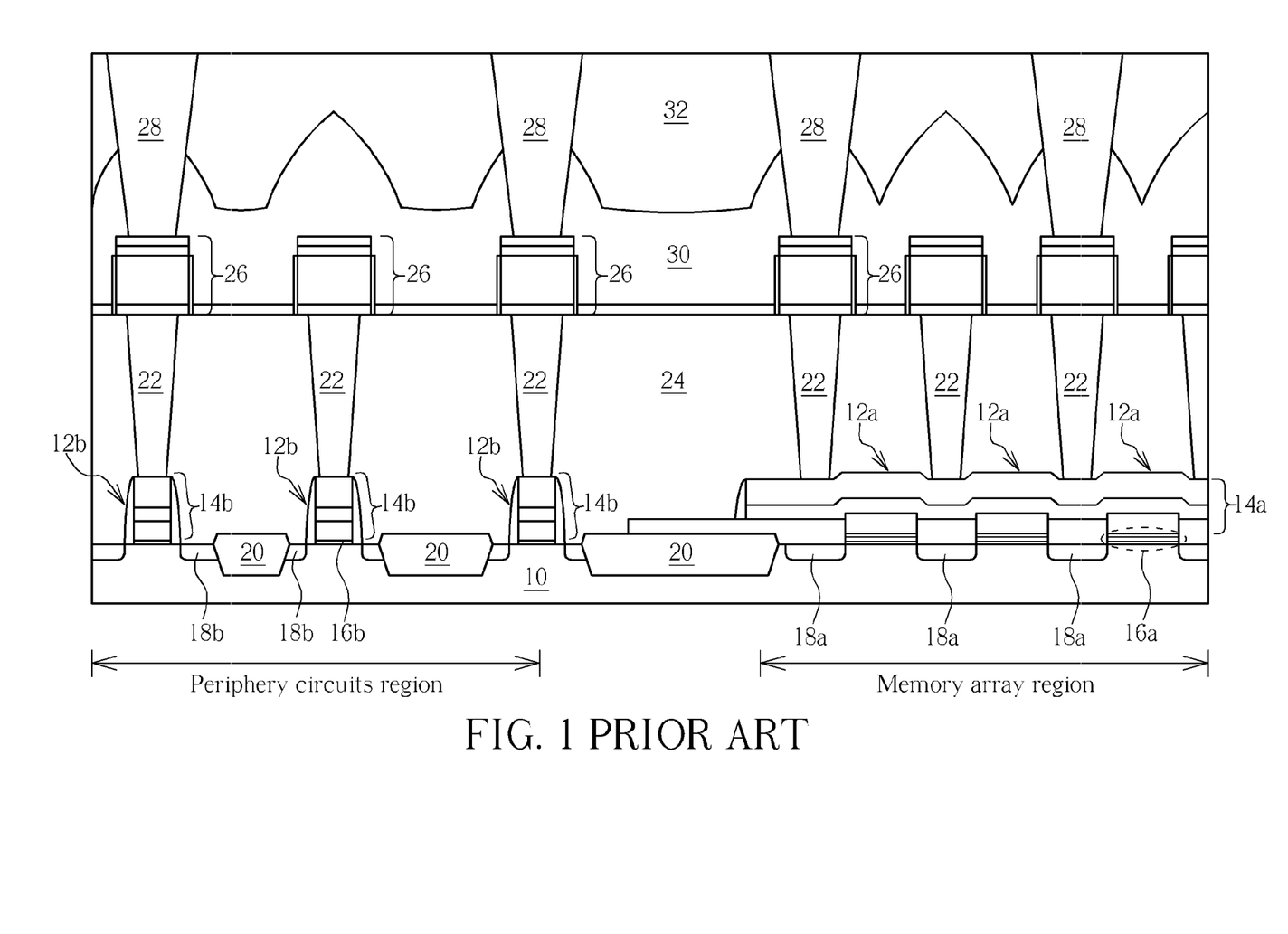
FIG. 1 shows a sectional view of a non-volatile memory according to the prior art.

FIG. 1 shows a sectional view of a non-volatile memory according to the prior art. As shown in FIG. 1, a transistor 12a and a transistor 12b are positioned, respectively, in the periphery circuits region and the memory array region in the substrate 10. The transistor 12a includes a gate 14a, a gate dielectric layer 16a, and a source/drain doping region 18a positioned in two opposite sides of the gate 14a. The transistor 12b includes a gate 14b, a gate dielectric layer 16b, and a source/drain doping region 18b positioned in two opposite sides of the gate 14b. The transistors 12a, 12b are respectively isolated from each other by an insulator 20. Interlayer dielectric layers 24, 30, 32 are formed on the gates 14a, 14b. A contact plug 22, wires 26 and a via plug 28 are positioned in the interlayer dielectric layers 24, 30, 32 to connect elements and wires electrically.

The interlayer dielectric layer 24 can be a borophosposilicate glass, an undoped silicate glass or other insulating materials. The interlayer dielectric layer 30 is composed of super silicon rich oxide (SSRO) or silicon rich oxide (SRO). The interlayer dielectric layer 32 can be tetraethylorthosilicate (TEOS) based silicon oxide layer or other insulating materials. Because the gate threshold voltage may be shifted by the UV light, the SSRO or SRO of the interlayer dielectric layer 30 is usually utilized as a UV blocking layer in the conventional technology.

The SSRO and the SRO include a high proportion of silicon, and therefore, the etching rate is low. This low etching rate may lead to over etching or insufficient etching of the contact hole if the etching time is not well controlled. Furthermore, the SSRO and SRO may not be removed completely by the etching process due to the low etching rate. The remaining SSRO or SRO in a dead space (a region that is difficult to etch) may lead to a punch though effect. In addition, the conventional non-volatile memory has electricity leakage problem. The electricity leaks usually happen at the top surface of the gates 14a, 14b or between the gates 14a, 14b and the substrate 10.

Therefore, a new structure to solve the electricity leakage and problems caused by the remaining SSRO and SRO is required.

SUMMARY OF THE INVENTION

The primary objective of the present invention is to provide a semiconductor structure which has an electric leakage protection spacer and an electric leakage protection layer to prevent current leakage. The semiconductor structure of the present invention further has a novel UV blocking layer which can solve aforementioned problems caused by the SSRO and SRO.

According to the preferred embodiment of the present invention, the method of the present invention comprises: providing a substrate comprising a conductive layer; forming a dielectric layer on the conductive layer, wherein the dielectric layer comprises at least an amorphous silicon layer; forming a contact hole to partly expose the conductive layer; and forming a contact plug in the contact hole.

According to another preferred embodiment of the present invention, a semiconductor structure of the present invention at least comprises: a substrate comprising a conductive layer, a dielectric layer positioned on the conductive layer, wherein the dielectric layer at least comprises an amorphous silicon layer and a contact plug positioned in the dielectric layer.

In the present invention, the SSRO or SRO utilized as an UV blocking layer is replaced by amorphous silicon. Therefore, the low etching rate of the SSRO or SRO will not cause the fabricating problem during the etching process of making the contact hole. The electric leakage protection material is positioned in the dielectric layer and the sidewall of the contact hole. In this way, the sidewall of the contact hole is surrounded by the electric leakage protection material and current leakage can be controlled.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
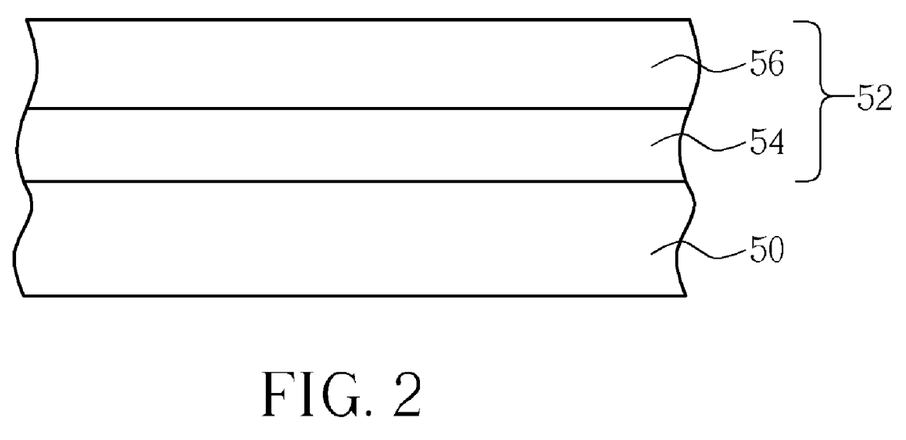
FIG. 2 to FIG. 7 are schematic diagrams showing steps of the method of the first embodiment of the present invention.

FIG. 2 to FIG. 7 are schematic diagrams showing a method of making the semiconductor structure according to the first embodiment of the present invention. As shown in FIG. 2, a substrate 50 including a conductive layer 52 is provided. The conductive layer 52 is positioned on the surface of the substrate 50. The conductive layer 52 can be a gate structure which is composed of a doped polysilicon layer 54 and a silicide layer 56. The material of the gate structure is not limited to doped polysilicon and salicide, and other conductive materials are applicable in this embodiment.

Figure 3:
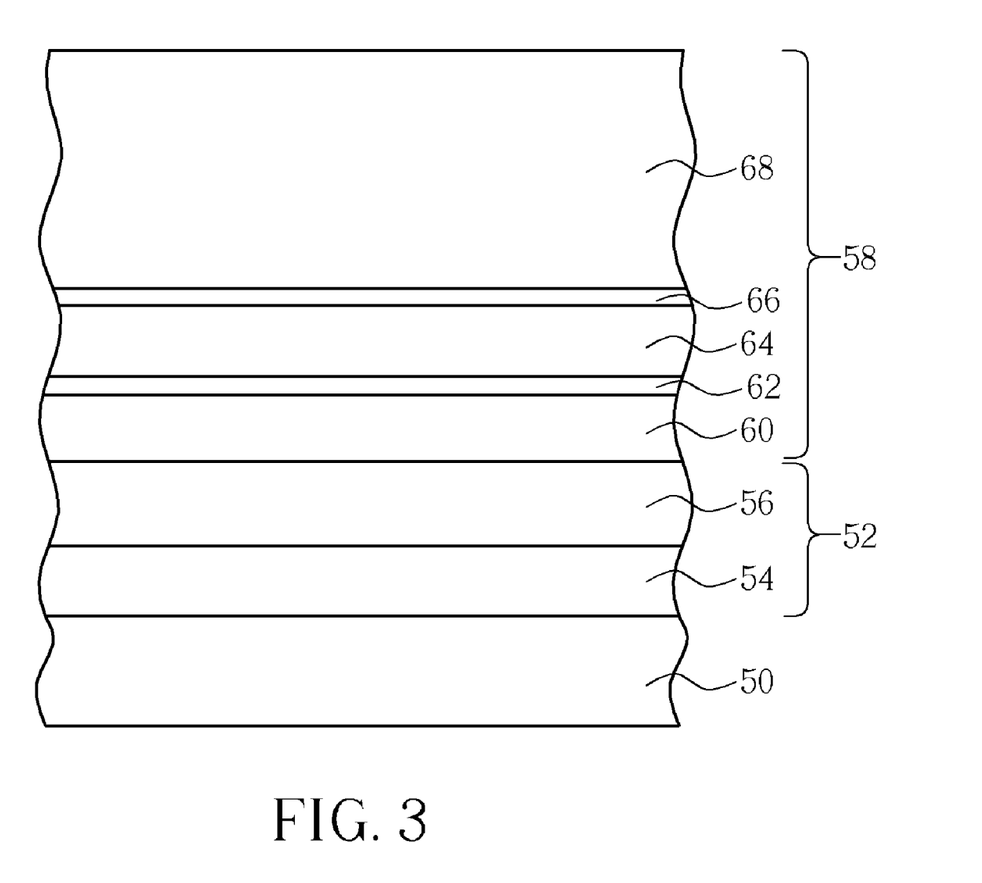

As shown in FIG. 3, a dielectric layer 58 is disposed on the conductive layer 52. The steps of forming the dielectric layer include: a first silicon oxide layer 60, an amorphous silicon layer 62, a second silicon oxide layer 64, an electric leakage protection layer 66 and an insulator 68 sequentially formed on the surface of the conductive layer 52. Then, the insulator 68 is planarized by a chemical mechanical polishing process. The first silicon oxide layer 60 and the second silicon oxide layer 64 include undoped silicate glass and the insulator 68 includes borophosposilicate glass. The electric leakage protection layer 66 includes silicon nitride, silicon carbon and silicon oxynitride. According to the preferred embodiment of the present invention, the preferred material of the electric leakage protection layer 66 is silicon nitride.

Figure 4:
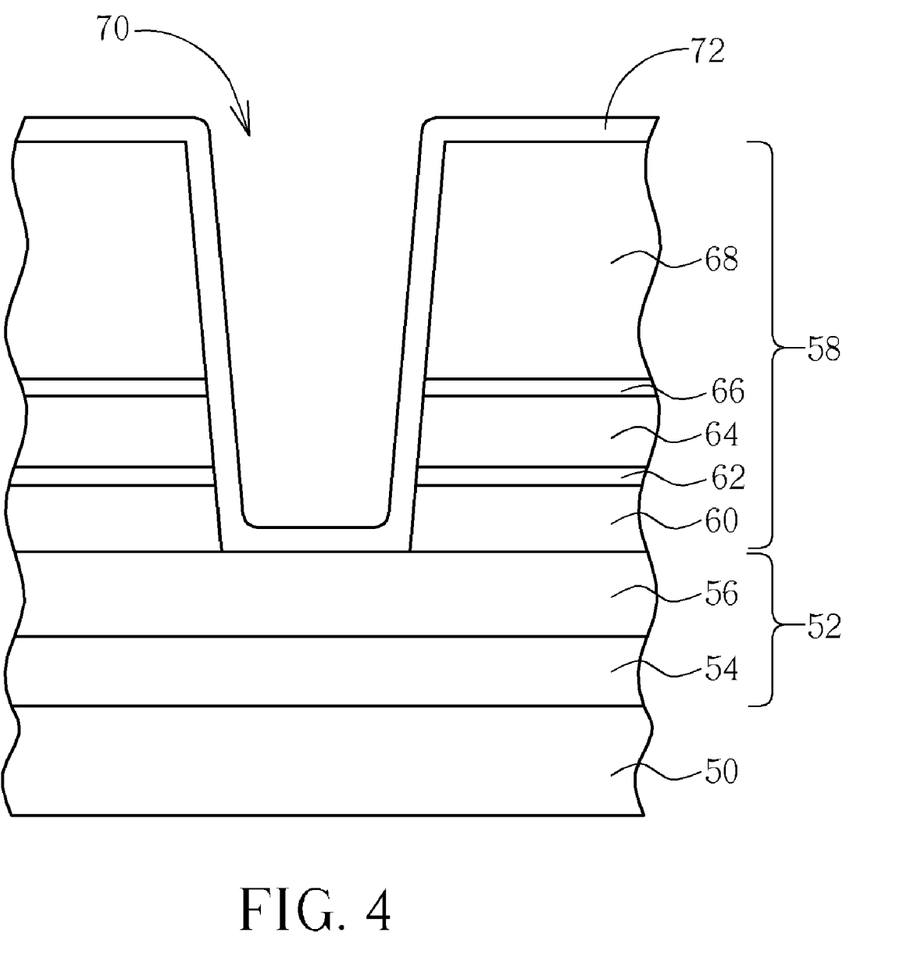

As shown in FIG. 4, a contact hole 70 is formed in the dielectric layer 58 and the surface of the conductive layer 52 is exposed through the contact hole 70. Then, an insulator 72 is formed on the surface of the contact hole 70 and the surface of the dielectric layer 58.

Figure 5:
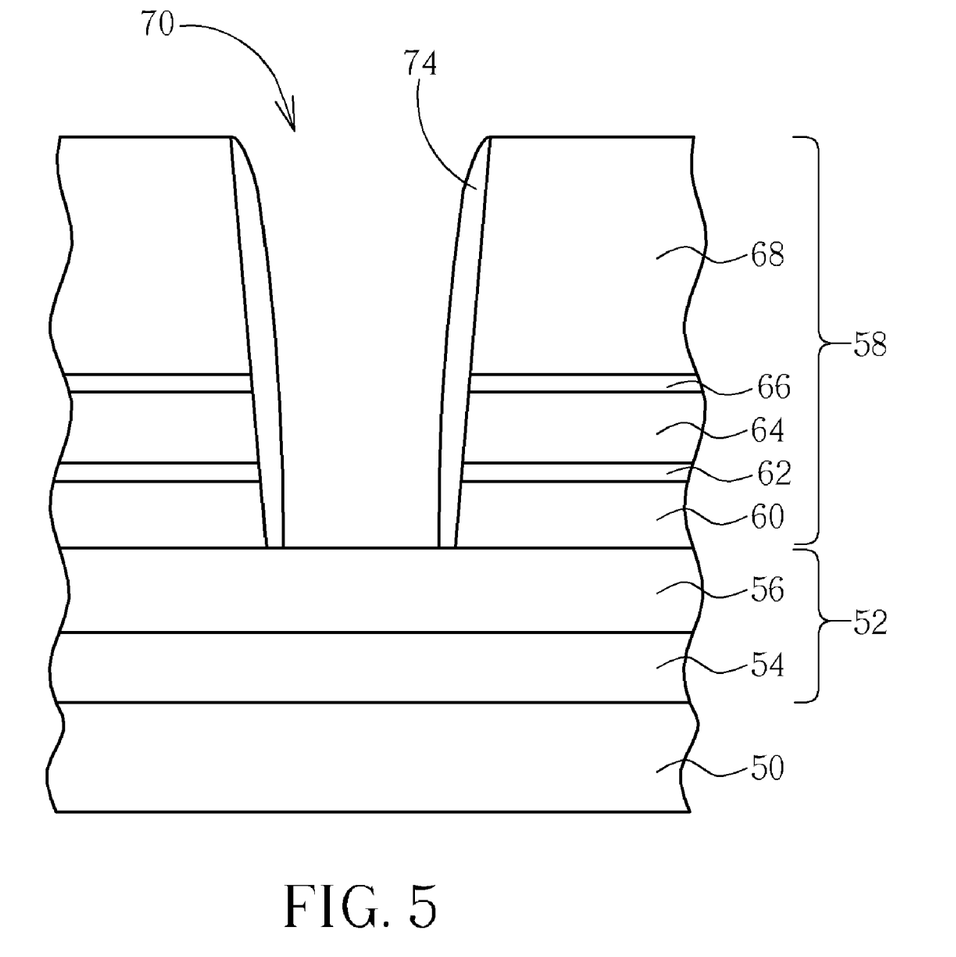

As shown in FIG. 5, an electric leakage protection spacer 74 is formed on the sidewall of the contact hole 70 by performing an anisotropic etching process on the insulator 72. In this way, the sidewall of the contact hole 70 is totally covered by the electric leakage protection spacer 74. In addition, the electric leakage protection spacer 74 includes silicon nitride, silicon carbon and silicon oxynitride. According to the preferred embodiment of the present invention, the preferred material of the electric leakage protection spacer 74 is silicon nitride.

Figure 6:
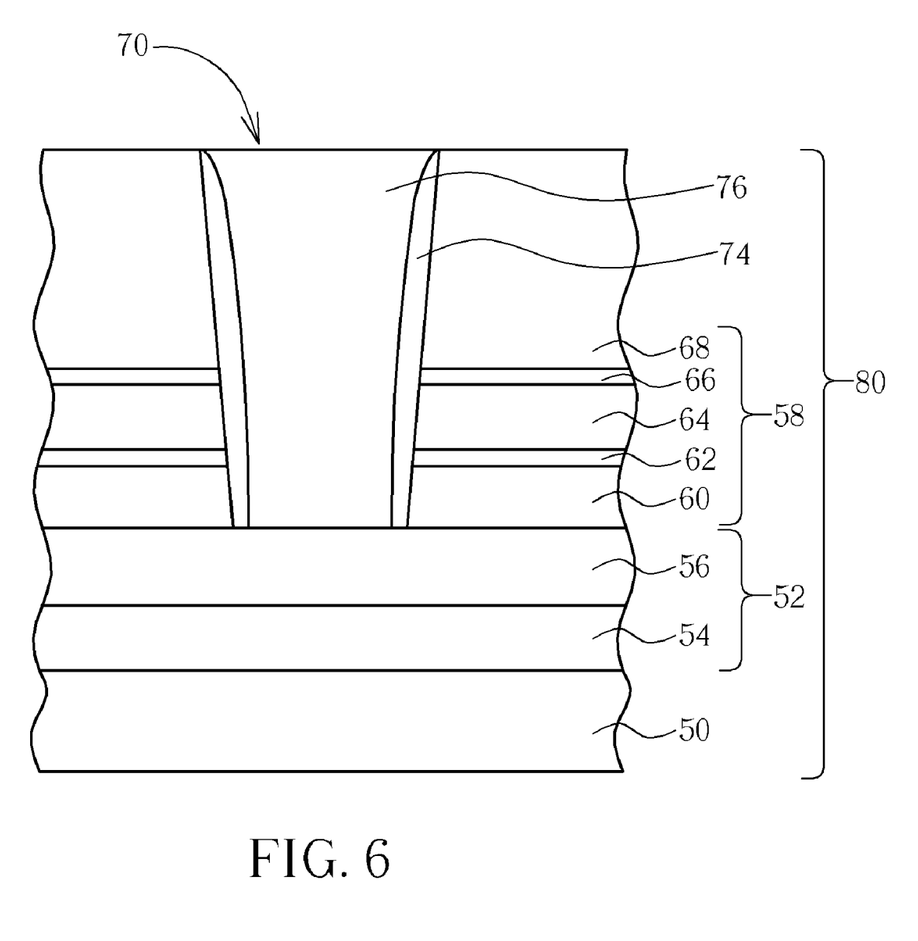

As shown in FIG. 6, a contact plug 76 is formed in the contact hole 70. The contact plug 76 includes tungsten, titanium nitride (TiN) and titanium. At this point, the semiconductor structure 80 which can prevent electric leaks and block UV light is totally formed.

Figure 7:
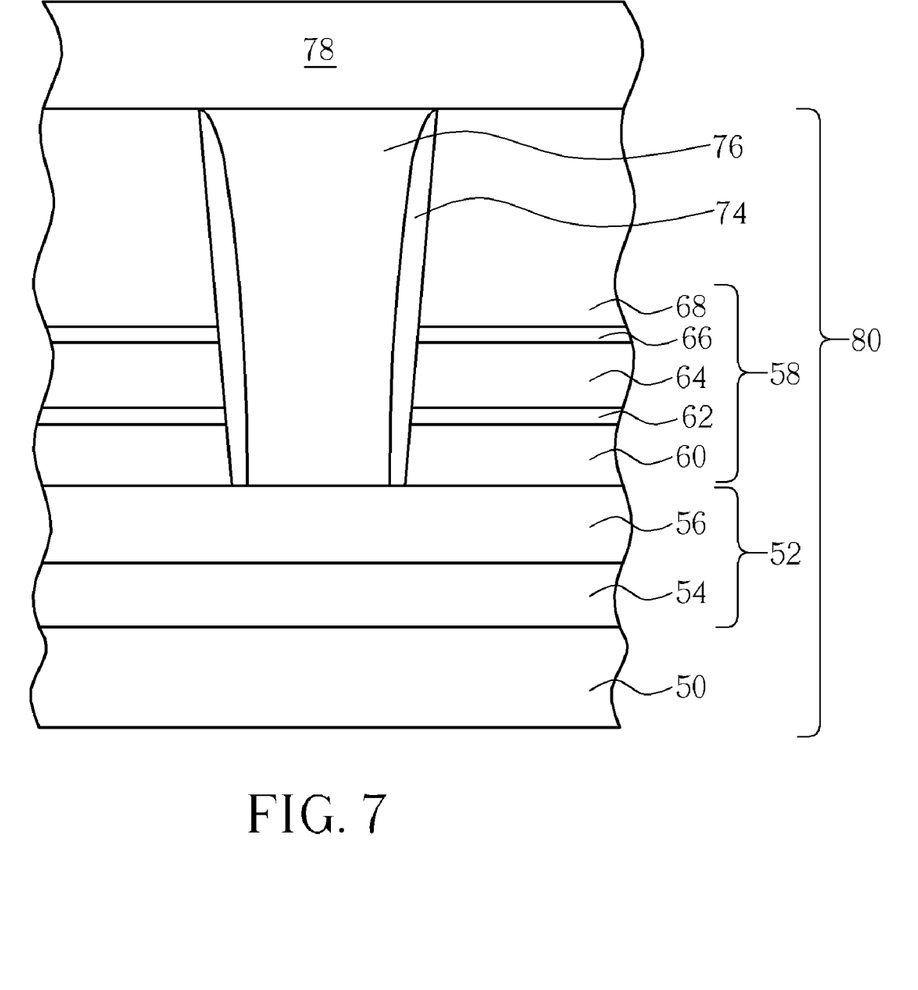

As shown in FIG. 7, an interlayer dielectric layer 78 is formed in the dielectric layer 58. According to the present invention, the amorphous silicon layer 62 is used to block UV light, therefore, the SSRO or SRO which is the conventional UV blocking material is no longer needed in the interlayer dielectric layer 78. According to different product requirements, the interlayer dielectric layer 78 can still include SSRO and/or SRO, however, as well as amorphous silicon for blocking UV light.

According to the method of making the semiconductor described in the first embodiment, the semiconductor structure 80 in FIG. 7 can be obtained. As shown in FIG. 7, a semiconductor structure 80 includes a substrate 50 comprising a conductive layer 52, wherein the conductive layer 52 is positioned on the surface of the substrate 50. The conductive layer 52 is a gate structure which is composed of a doped polysilicon layer 54 and a salicide layer 56. In addition, the semiconductor structure 58 further includes a dielectric layer 58 positioned on the conductive layer 52. The dielectric layer 58 is a stack structure which includes (from bottom to top) a first silicon oxide layer 60, an amorphous silicon layer 62, a second silicon layer 64, an electric leakage protection layer 66 and an insulator 68. In addition, a contact plug 76 is positioned in the dielectric layer 58, wherein an electric leakage protection spacer 74 is positioned between the dielectric layer 58 and the contact plug 76.

The first silicon oxide layer 60 and the second silicon oxide layer 64 include undoped silicate glass and the insulator 68 includes borophosposilicate glass. Both the electric leakage protection layer 66 and the electric leakage protection spacer 74 include silicon nitride, silicon carbon and silicon oxynitride. According to the preferred embodiment of the present invention, the preferred material of the electric leakage protection layer 66 and the electric leakage protection spacer 74 is silicon nitride. An interlayer dielectric layer 78 is positioned on the dielectric layer 58.

The first embodiment of the present invention shows a semiconductor structure 80 having a contact plug connected to the gate structure. The fabricating method of the present invention can also be applied to a semiconductor structure having a contact plug connected directly to the substrate. This fabricating method will be illustrated in the following second embodiment of the present invention. To simplify the illustration, elements having the same function as elements in the first embodiment will use the same numerals.

FIG. 8 to FIG. 13 are schematic diagrams showing a method of making the semiconductor structure according to the second embodiment of the present invention.

Figure 8:
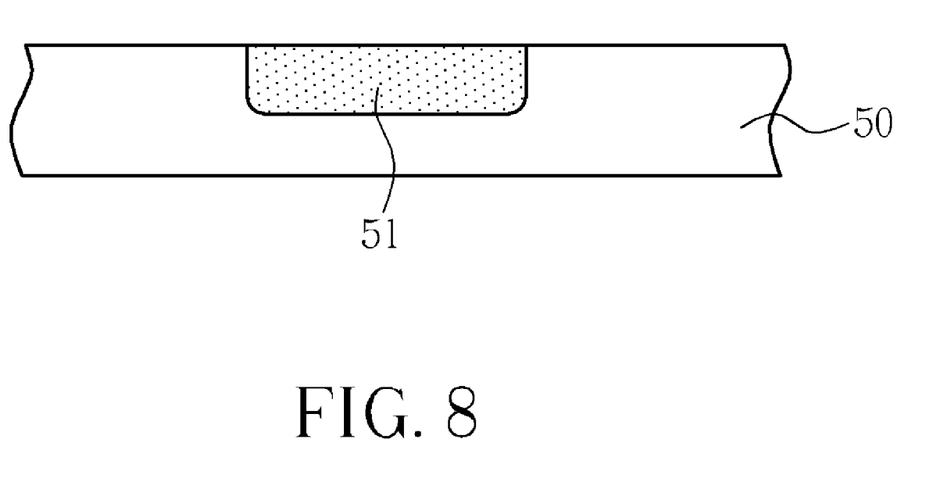
FIG. 8 to FIG. 13 are schematic diagrams showing steps of the method of the second embodiment of the present invention.

As shown in FIG. 8, a substrate 50 including a conductive layer 51 is provided. The conductive layer 51 is positioned in the substrate 50, and the conductive layer 52 can be a doping region.

Figure 9:
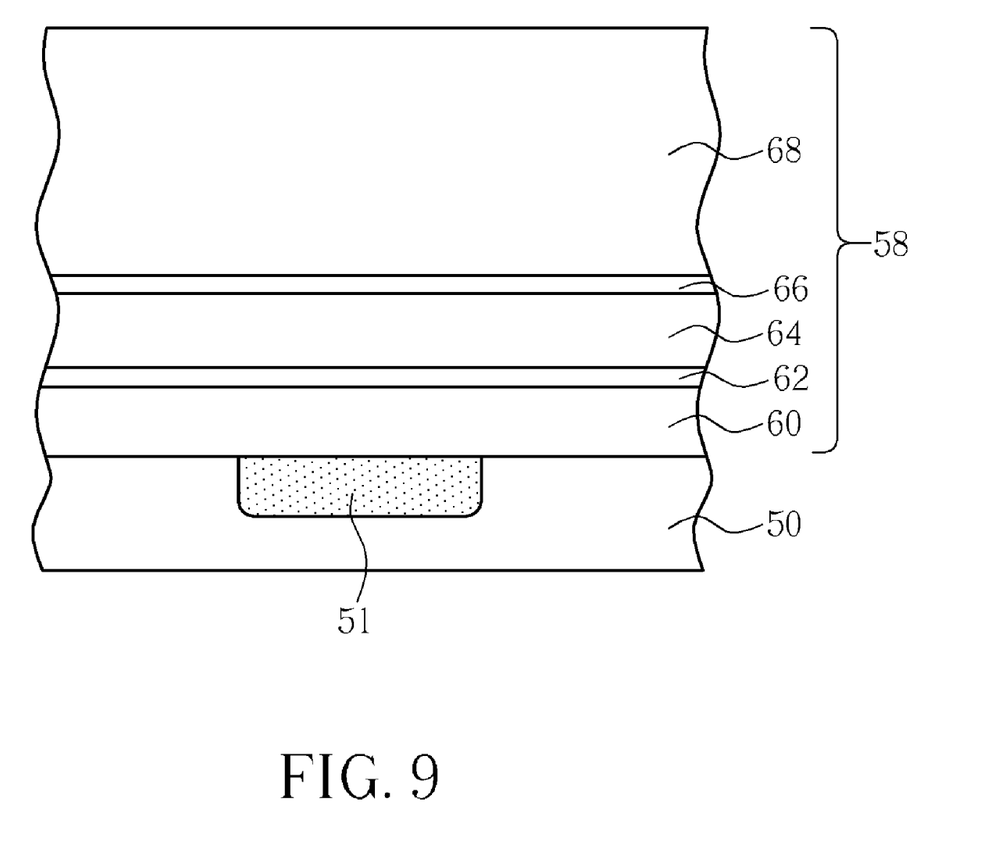

As shown in FIG. 9, a dielectric layer 58 is disposed on the conductive layer 52. The steps of forming the dielectric layer include: a first silicon oxide layer 60, an amorphous silicon layer 62, a second silicon oxide layer 64, a electric leakage protection layer 66 and an insulator 68 are formed on the surface of the conductive layer 51 in sequence. Then, the insulator 68 is planarized by a chemical mechanical polishing process. The first silicon oxide layer 60 and the second silicon oxide layer 64 include undoped silicate glass and the insulator 68 includes borophosposilicate glass. The electric leakage protection layer 66 includes silicon nitride, silicon carbon and silicon oxynitride. According to the preferred embodiment of the present invention, the preferred material of the electric leakage protection layer 66 is silicon nitride.

Figure 10:
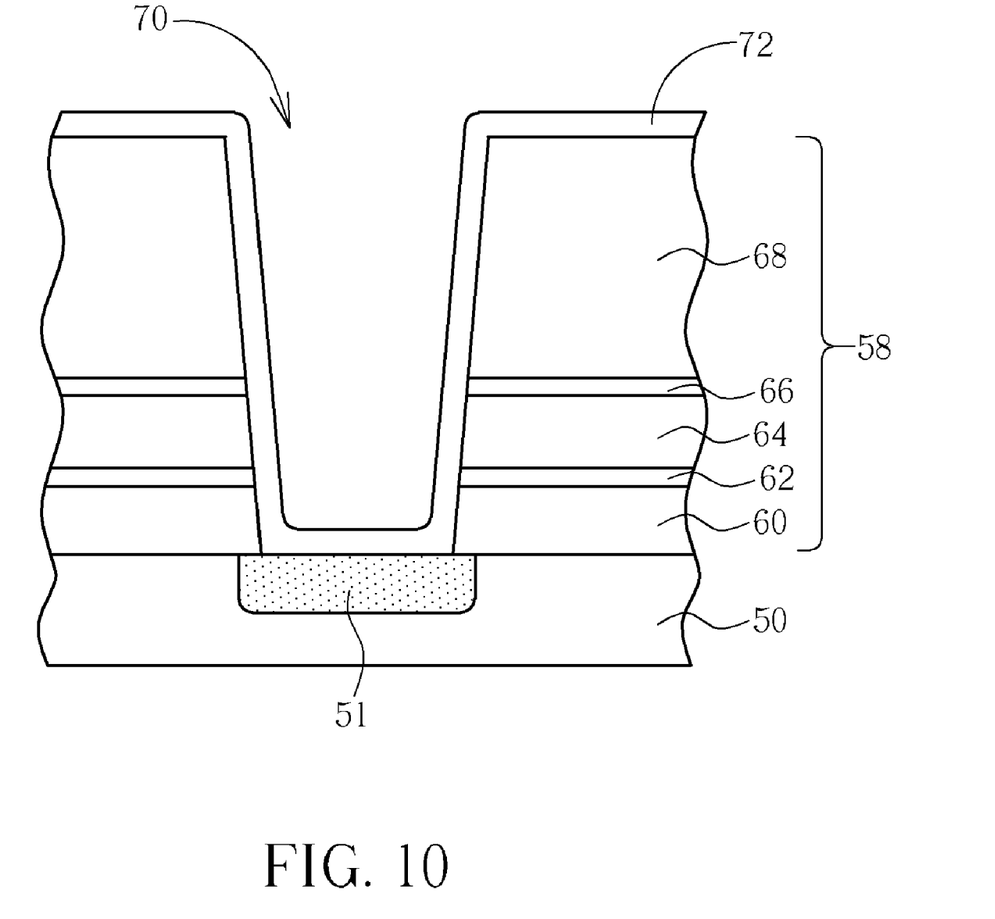

As shown in FIG. 10, a contact hole 70 is formed in the dielectric layer 58 and the surface of the conductive layer 51 is exposed through the contact hole 70. Then, an insulator 72 is formed on the surface of the contact hole 70 and the surface of the dielectric layer 58.

Figure 11:
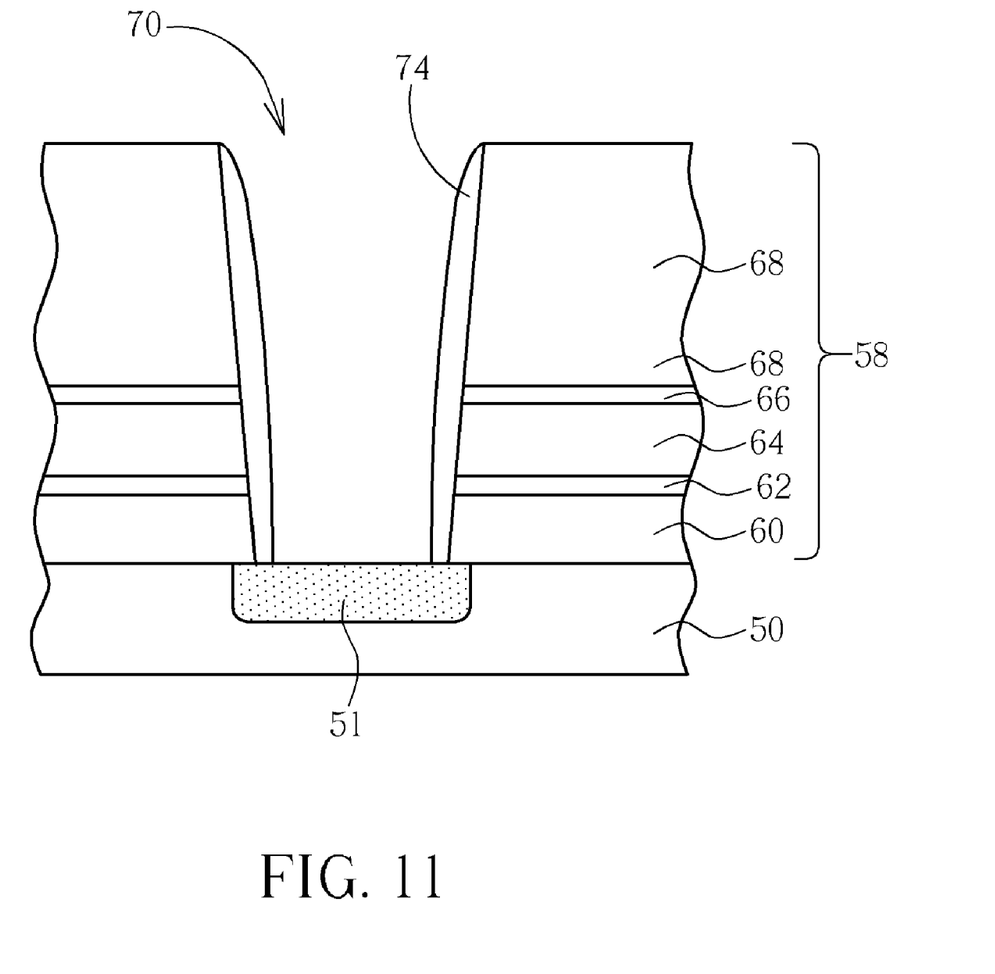

As shown in FIG. 11, an electric leakage protection spacer 74 is formed on the sidewall of the contact hole 70 by performing anisotropic etching on the insulator 72. In this way, the sidewall of the contact hole 70 is totally covered by the electric leakage protection spacer 74. In addition, the electric leakage protection spacer 74 includes silicon nitride, silicon carbon and silicon oxynitride. According to the preferred embodiment of the present invention, the preferred material of the electric leakage protection spacer 74 is silicon nitride.

Figure 12:
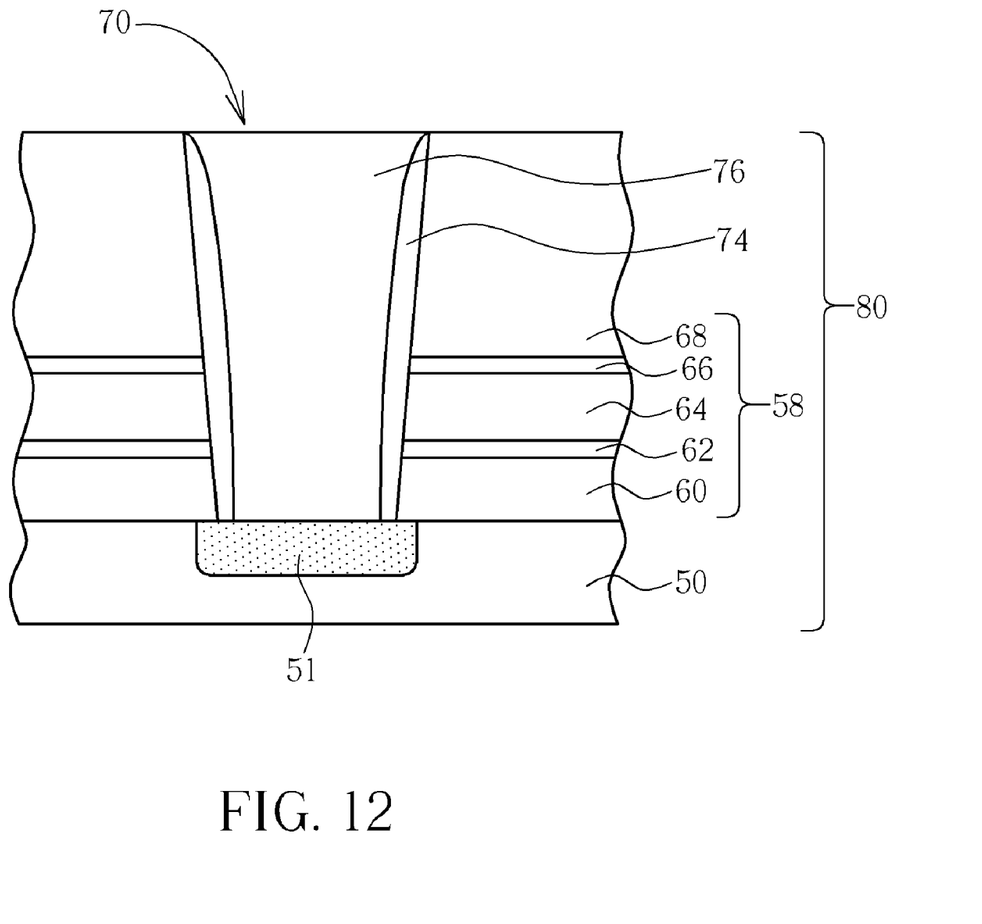

As shown in FIG. 12, a contact plug 76 is formed in the contact hole 70. The contact plug includes tungsten, titanium nitride (TiN) and titanium. At this point, the semiconductor structure 80 which can prevent electric leaks and block UV light is totally formed.

Figure 13:
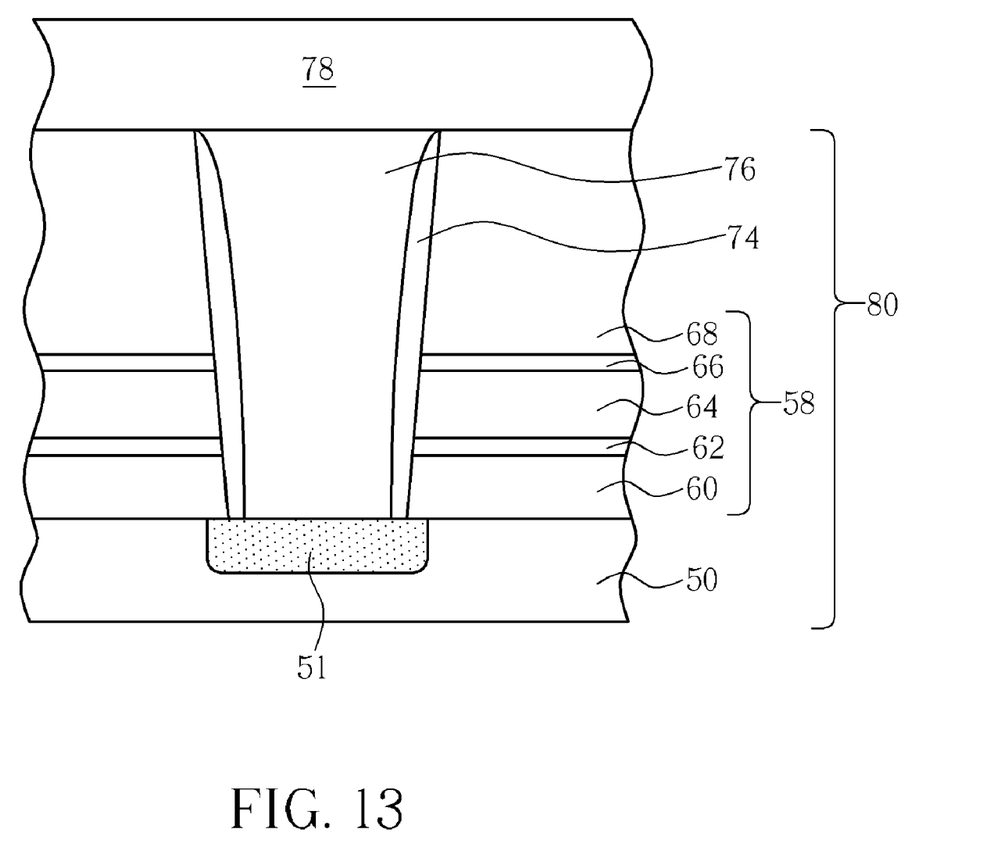

As shown in FIG. 13, an interlayer dielectric layer 78 is formed in the dielectric layer 58. According to the present invention, the amorphous silicon layer 62 is used to block UV light, therefore, SSRO or SRO which are the conventional UV blocking materials can also be utilized in the interlayer dielectric layer 78 optionally.

According to the method of making the semiconductor described in the second embodiment, a semiconductor structure 80 in FIG. 13 can be obtained. As shown in FIG. 13, a semiconductor structure 80 includes a substrate 50 comprising a conductive layer 51, wherein the conductive layer 51 is in the substrate 50. The conductive layer 51 can be a doping region. In addition, the semiconductor structure 80 further includes a dielectric layer 58 positioned on the substrate 50. The dielectric layer 58 is a stack structure which includes (from bottom to top) a first silicon oxide layer 60, an amorphous silicon layer 62, a second silicon layer 64, an electric leakage protection layer 66 and an insulator 68. In addition, a contact plug 76 is positioned in the dielectric layer 58, wherein an electric leakage protection spacer 74 is positioned between the dielectric layer 58 and the contact plug 76.

The first silicon oxide layer 60 and the second silicon oxide layer 64 include undoped silicate glass and the insulator 68 includes borophosposilicate glass. Both the electric leakage protection layer 66 and the electric leakage protection spacer 74 include silicon nitride, silicon carbon and silicon oxynitride. According to the preferred embodiment of the present invention, the preferred material of the electric leakage protection layer 66 and the electric leakage protection spacer 74 is silicon nitride. An interlayer dielectric layer 78 is further positioned on the dielectric layer 58.

The amorphous silicon used in the present invention can block UV light. Therefore, the SSRO or SRO which acts as a UV light block layer in the conventional technology can be replaced by the amorphous silicon. In this way, the over etching or insufficient etching of the contact hole due to the low etching rate of the SSRO or SRO can be avoided. In addition, since the SSRO or SRO is replaced, the problem of residue of the SSRO and SRO in the dead space can be avoided as well, and the process window can be increased. Additionally, because the silicon nitride is positioned in the dielectric layer and the contact hole is surrounded by the silicon nitride, the semiconductor structure can prevent charge loss such as the electric leaks on the top surface of the gate or between the gate and the substrate.

Those skilled in the art will readily observe that numerous modifications and alterations of the device and method may be made while retaining the teachings of the invention.

What is claimed is:

1. A semiconductor structure comprising:
   a substrate comprising a conductive layer;
   a dielectric layer positioned on the conductive layer, wherein the dielectric layer is a stack structure having therein a silicon oxide layer, an electric leakage protection layer, an amorphous silicon layer and an insulator, and the amorphous silicon layer is positioned below a topmost layer of the stack structure and below the electric leakage protection layer; and
   a contact plug positioned in the dielectric layer.

2. The semiconductor structure of claim 1, wherein an electric leakage protection spacer is positioned between the contact plug and the dielectric layer, wherein the electric leakage protection spacer is an insulating material.

3. The semiconductor structure of claim 1, wherein the electric leakage protection layer comprises silicon nitride, silicon carbon and silicon oxynitride.

4. The semiconductor structure of claim 2, wherein the electric leakage protection spacer comprises silicon nitride, silicon carbon and silicon oxynitride.

5. The semiconductor structure of claim 1, wherein the silicon oxide layer is an undoped silicate glass (USG).

6. The semiconductor structure of claim 1, wherein the insulator is a borophosphosilicate glass.

7. The semiconductor structure of claim 1, wherein the conductive layer comprises a gate.

8. The semiconductor structure of claim 1, the conductive layer comprises a doping region.

9. The semiconductor structure of claim 1, wherein the contact plug comprises tungsten, titanium nitride (TiN) and titanium.

10. A semiconductor structure comprising:
    a substrate comprising a conductive layer;
    a dielectric layer positioned on the conductive layer, wherein the dielectric layer is a stack structure having therein an amorphous silicon layer positioned below a topmost layer of the stack structure;
    a contact plug positioned in the dielectric layer; and
    an electric leakage protection spacer positioned between the contact plug and the dielectric layer, wherein the electric leakage protection spacer comprises silicon nitride, silicon carbon and silicon oxynitride.

11. A semiconductor structure comprising:
    a substrate comprising a conductive layer;
    a dielectric layer positioned on the conductive layer, wherein the dielectric layer is a stack structure comprising a first silicon oxide layer, an amorphous silicon layer, a second silicon oxide layer, an electric leakage layer, and an insulator disposed from bottom to top, and the insulator is the topmost layer of the stack structure; and
    a contact plug positioned in the dielectric layer.

* * * * *